United States Patent
Alers et al.

(10) Patent No.: US 6,320,244 B1
(45) Date of Patent: Nov. 20, 2001

(54) INTEGRATED CIRCUIT DEVICE HAVING DUAL DAMASCENE CAPACITOR

(75) Inventors: Glenn B. Alers, Chatham, NJ (US); Seungmoo Choi, Orlando, FL (US); Sailesh Mansinh Merchant, Orlando, FL (US); Pradip Kumar Roy, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/388,682

(22) Filed: Sep. 2, 1999

Related U.S. Application Data (60) Provisional application No. 60/115,526, filed on Jan. 12, 1999, provisional application No. 60/115,529, filed on Jan. 12, 1999, and provisional application No. 60/115,531, filed on Jan. 12, 1999.

(51) Int. Cl.[7] .................................................... H01L 29/00
(52) U.S. Cl. ............................ 257/534; 257/532; 438/386
(58) Field of Search .................................... 257/532, 534; 438/386

(56) References Cited

U.S. PATENT DOCUMENTS

| | | | |
|---|---|---|---|
| 4,685,197 | * 8/1987 | Tigelaar et al. | 438/386 |
| 5,416,042 | 5/1995 | Beach et al. | 437/60 |
| 5,479,316 | * 12/1995 | Smrtic et al. | 361/322 |
| 5,702,981 | 12/1997 | Maniar et al. | 438/627 |
| 5,714,779 | 2/1998 | Auer et al. | 257/306 |
| 5,786,259 | 7/1998 | Kang | 438/396 |
| 5,801,094 | 9/1998 | Yew et al. | 438/624 |
| 5,808,855 | 9/1998 | Chan et al. | 361/321.4 |
| 5,841,186 | 11/1998 | Sun et al. | 257/635 |
| 5,891,799 | 4/1999 | Tsui | 438/624 |
| 5,912,044 | * 6/1999 | Farooq et al. | 427/79 |
| 5,933,761 | 8/1999 | Lee | 438/783 |
| 6,075,691 | * 6/2000 | Duenas et al. | 361/321.5 |
| 6,078,093 | * 6/2000 | Lee | 257/532 |
| 6,136,641 | * 10/2000 | Won et al. | 438/240 |
| 6,150,690 | * 11/2000 | Ishibashi et al. | 257/306 |
| 6,174,769 | * 1/2001 | Lou | 438/253 |

OTHER PUBLICATIONS

Singer, *Semiconductor International*, "Tantalum, Copper and Damascene: The Future of Interconnects", (Jun. 1998), pp. 1–8.
Singer, *Semiconductor International*, "Dual–Damascene Challenges Dielectric–Etch", (Aug. 1999), pp. 1–5.

* cited by examiner

Primary Examiner—Nathan Flynn
Assistant Examiner—Scott Wilson
(74) Attorney, Agent, or Firm—Allen, Dyer, Doppelt, Milbrath & Gilchrist, P.A.

(57) ABSTRACT

An integrated circuit device includes a dielectric layer having an opening therein, and a capacitor comprising in stacked relation a lower electrode lining the opening, a capacitor dielectric layer adjacent the lower electrode, and an upper electrode adjacent the capacitor dielectric layer. The capacitor has a substantially planar upper surface substantially flush with adjacent upper surface portions of the dielectric layer. Additionally, the edges of the lower electrode and the capacitor dielectric layer preferably terminate at the upper surface of the capacitor. Also, the capacitor dielectric may include a high-k, high quality and low leakage dielectric, and which prevents the reduction of the capacitor dielectric by the metal of the upper and lower metal electrodes.

21 Claims, 5 Drawing Sheets

INTEGRATED CIRCUIT DEVICE HAVING DUAL DAMASCENE CAPACITOR

RELATED APPLICATION

This application is based upon prior filed copending provisional application Ser. Nos. 60/115,526; 60/115,529; and 60/115,531 all filed on Jan. 12, 1999.

FIELD OF THE INVENTION

The present invention relates to the field of integrated circuits, and, more particularly, to integrated circuit devices having capacitors.

BACKGROUND OF THE INVENTION

Capacitors are used in semiconductor devices, such as integrated circuits (ICs) for storing electrical charge. In ICs, such as dynamic random access memory (DRAM), capacitors are used for storage in the memory cells. Typically, capacitors formed in ICs include a lower electrode made of, e.g., polycrystalline silicon (polysilicon), a dielectric layer made of, e.g., tantalum pentoxide and/or barium strontium titantate, and an upper electrode made of, e.g., titanium nitride, titanium, tungsten, platinum or polysilicon.

In recent years, the development of the semiconductor memory device has required higher packing density, the area occupied by a capacitor of a DRAM storage cell shrinks, thus decreasing the capacitance of the capacitor because of its smaller electrode surface area. However, a relatively large capacitance is required to achieve a high signal-to-noise ratio in reading the memory cell. Therefore, it is desirable to reduce the cell dimension and yet obtain a high capacitance. This can be accomplished with a metal electrode capacitor, for example. Also, highly integrated memory devices, such as DRAMs, require a very thin dielectric film for the data storage capacitor. To meet this requirement, the capacitor dielectric film thickness will be below 2.5 nm of $SiO_2$ equivalent thickness. Use of a thin layer of a material having a higher relative permittivity, e.g. $Ta_2O_5$, in place of the conventional $SiO_2$ or $Si_3N_4$ layers is useful in achieving desired performance.

A chemical vapor deposited (CVD) $Ta_2O_5$ film can be used as a dielectric layer for this purpose, because the dielectric constant (k) of $Ta_2O_5$ is approximately three times that of a conventional $Si_3N_4$ capacitor dielectric layer. However, one drawback associated with the $Ta_2O_5$ dielectric layer is undesired leakage current characteristics. Accordingly, although $Ta_2O_5$ material has inherently higher dielectric properties, $Ta_2O_5$ typically may produce poor results due to leakage current. For example, U.S. Pat. No. 5,780,115 to Park et al., discloses the use of $Ta_2O_5$ as the dielectric for an integrated circuit capacitor with the electrode layer being formed of titanium nitride (TiN). However, at temperatures greater than 600° C., this type of layered structure has a stability problem because the titanium in the TiN layer tends to reduce the $Ta_2O_5$ of the dielectric layer into elemental tantalum.

Traditionally, interconnection between two conductors in a semiconductor device has been provided by a plug structure such as a tungsten plug, for example, for an electrical connection between first and second metal lines. Such structures require three separate processing steps including one for the formation of each of the two conductors and one for the formation of the tungsten plug structure. Additionally, greater interest has been shown by manufacturers of semiconductor devices in the use of copper and copper alloys for metallization patterns, such as in conductive vias and interconnects. Copper, compared to aluminum, has both good electromigration resistance and a relatively low electrical resistivity of about 1.7 µohm·cm. Unfortunately, copper is difficult to etch. Consequently, dual damascene processes have been developed to simplify the process steps and eliminate a metal etch step to form copper interconnects. Dual damascene processes are also used with aluminum interconnects.

A dual damascene structure has a bottom portion or via that contacts an underlying conductor and replaces the function of a plug structure in a traditional interconnect structure. The dual damascene structure also has a top portion or inlaid trench that is used for the formation of a second conductor. Because the bottom and top portions of a dual damascene structure are in contact with each other, they can be filled simultaneously with the same conductive material, e.g. copper. This eliminates the need to form a plug structure and an overlying conductive layer in separate processing steps.

Conventionally, in the dual damascene process, capacitors are usually formed in a separate level by depositing a first conductive layer, forming the dielectric therebetween, forming a second conductive layer, and then patterning and etching the layered structure. The conductive layers are typically formed of polysilicon or titanium nitride, for example. Next an oxide is formed over the capacitors and results in surface topographies above the capacitors. This requires chemical mechanical polishing (CMP) to planarize the oxide layer before subsequent layers are formed.

Thus, the conventional process of making capacitors requires additional time due to the etching of the conductive layers as well as the CMP step. Also, if forming a capacitor with metal electrodes, i.e. a metal-insulator-metal (MIM) capacitor, the metal etch step required is not fully compatible with the dual damascene process. In other words, as discussed above, the dual damascene process is used specifically to avoid metal etching; therefore, using a metal etch step within a dual damascene process is undesirable.

As can be seen from the above discussion, there is a need for integration of a high-density metal electrode capacitor which is compatible with the dual damascene process. Furthermore, there is a need for a capacitor dielectric, for such a metal electrode capacitor, that is a high-k, high quality and low leakage dielectric, and which prevents the reduction of the dielectric by the metal of the electrode.

SUMMARY OF THE INVENTION

In view of the foregoing background, it is therefore an object of the invention to provide an integrated circuit device including a high-density capacitor having metal electrodes and which is compatible with a dual damascene process.

It is another object of the invention to provide a method of making an integrated circuit device with the dual damascene process and including a high-density capacitor having metal electrodes.

Furthermore, it is another object of the invention to provide a capacitor dielectric, for such a metal electrode capacitor, that is a high-k, high quality and low leakage dielectric, and which prevents the reduction of the dielectric by the metal of the electrode.

These and other objects, features and advantages in accordance with the present invention are provided by an integrated circuit device including: a dielectric layer, adjacent a semiconductor substrate, and having an opening therein;

and a capacitor comprising in stacked relation a lower electrode lining the opening, a capacitor dielectric layer adjacent the lower electrode, and an upper electrode adjacent the capacitor dielectric layer. The capacitor has a substantially planar upper surface substantially flush with adjacent upper surface portions of the dielectric layer. Additionally, the edges of the lower electrode and the capacitor dielectric layer preferably terminate at the upper surface of the capacitor.

Also, the opening may have a substantially uniform width between sidewalls of the opening from a top of the opening to a bottom of the opening. And, the opening may have a lower portion and an upper portion, the upper portion having a greater width than the lower portion. Furthermore, the dielectric layer may comprise a lower dielectric layer portion, an etch stop layer, and an upper dielectric layer portion. Thus, the upper portion of the opening may be in the upper dielectric layer portion and the etch stop layer, and a lower portion in the lower dielectric layer portion.

Also, the upper metal electrode may comprise a barrier metal layer adjacent the capacitor dielectric layer and a copper layer adjacent the barrier metal layer. The barrier metal layer may comprise tantalum nitride and each of the upper and lower metal electrodes may comprise tantalum nitride.

Furthermore, the capacitor dielectric layer preferably have a dielectric constant greater than about 25. The capacitor dielectric may comprise in stacked relation a first metal oxide layer, a tantalum oxide layer, and a second metal oxide layer. Also, each of the upper and lower metal electrodes may comprise a metal nitride.

Advantages in accordance with the present invention are also provided by a method of making an integrated circuit capacitor in an opening in a dielectric layer adjacent a semiconductor substrate. Specifically the method comprises: forming a lower metal electrode to line the opening in the dielectric layer; forming a capacitor dielectric to overlie the lower metal electrode; forming an upper metal electrode to overlie the capacitor dielectric layer; and planarizing an upper surface of the capacitor to be flush with adjacent upper surface portions of the dielectric layer. The steps of forming and planarizing preferably comprise forming and planarizing the lower electrode and capacitor dielectric layer to terminate at the upper surface of the capacitor.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for clarity.

Figure 1:
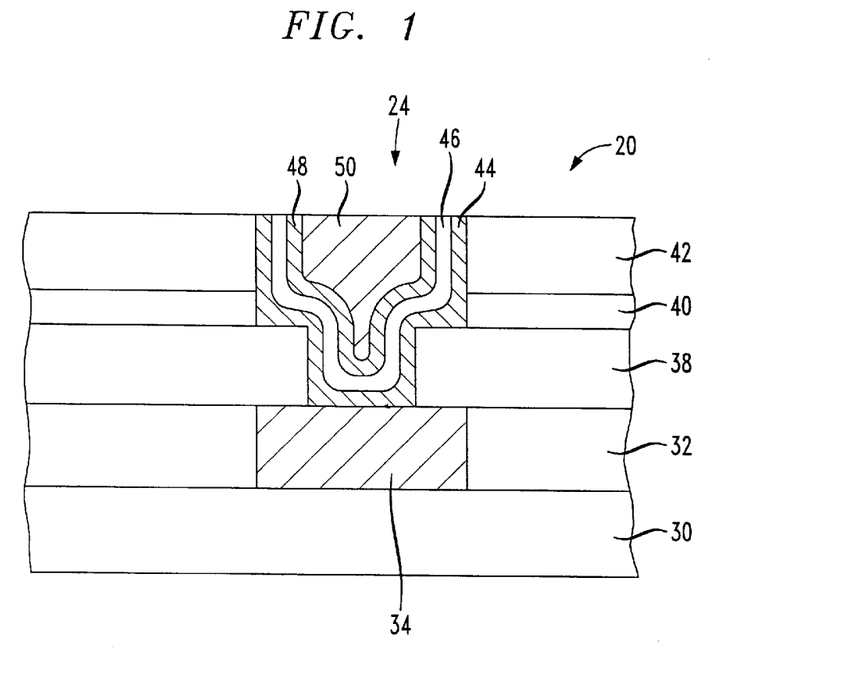
FIG. 1 is a cross-sectional view of an integrated circuit device including a capacitor having metal electrodes in accordance with an embodiment of the present invention.

Referring to FIG. 1, an integrated circuit device 20 including a metal electrode capacitor 24 formed on a semiconductor substrate 30 in accordance with the present invention, will now be described. The semiconductor substrate 30 is preferably silicon, or may be silicon or a polysilicon layer or structure formed on the substrate. A plurality of devices, such as transistors (not shown), are formed in the substrate 30 using well known techniques. The integrated circuit device 20 includes a first dielectric layer 32 adjacent the substrate 30. The first dielectric layer is formed from any suitable dielectric, e.g., silicon dioxide, silicon nitride and/or any material or alloy of material having a desired dielectric constant. Other suitable materials include tantalum pentoxide and barium strontium titantate, for example, as long as the dielectric does not affect the formation of the interconnect structure and capacitor of the present invention.

This first dielectric layer 32 is shown in FIG. 1 with an interconnect 34. The first dielectric layer 32 and the interconnect 34 illustrate an example of an underlying level of the integrated circuit device. The skilled artisan would appreciate that a plurality of interconnect levels and vias will be present throughout the device and at multiple levels within the device. A via is an opening formed in an interlevel dielectric layer to expose a certain portion of an underlying metal line to allow electrical contact to be made to the line. Normally, a conductive contact is then formed in the via to connect the underlying metal line with a subsequently formed overlying metal line.

The integrated circuit device 20 further includes a second dielectric layer 38 and a third dielectric layer 42. The second and third dielectric layers 38 and 42 are preferably separated by an etch stop layer 40. Again, the second and third dielectric layers 38 and 42 are formed from any suitable dielectric having a desired dielectric constant, as would readily be appreciated by the skilled artisan. The etch stop layer 40 is typically formed from silicon nitride and deposited by conventional techniques.

The capacitor 24 includes a lower electrode 44, a dielectric 46, and an upper electrode 48, 50. The lower electrode 44 is formed of a conductive metal such as tantalum nitride, titanium nitride or tungsten nitride, for example. The capacitor dielectric 46 is formed of a suitable dielectric material, e.g. silicon oxide, silicon nitride, tantalum oxide, or a composite dielectric having a desired dielectric constant. The capacitor 24 has a substantially planar upper surface substantially flush with adjacent upper surface portions of the third dielectric layer 42. Also, edges of the lower metal 44 electrode and the capacitor dielectric 46 terminate at the upper surface of the capacitor.

Preferably, the capacitor dielectric 46 has a dielectric constant greater than about 25 to achieve desired capacitor characteristics. The upper electrode comprises conductive metal layer 48 and conductive metal layer 50. The conductive metal layer 48 may be formed of tantalum nitride, for example, and the conductive metal layer 50 may be formed of copper. The conductive metal layer 48 may also act as a barrier layer to prohibit diffusion of the metal, e.g. copper, from the metal conductive layer 50 into the dielectric 46.

As described, the integrated circuit device 20 of the present invention provides a high-density capacitor 24 having metal electrodes 44, 48, 50 and which is compatible and integrated with dual damascene structures. As such, the capacitor 24 may be situated in a same level as other dual damascene structures.

Figure 2:
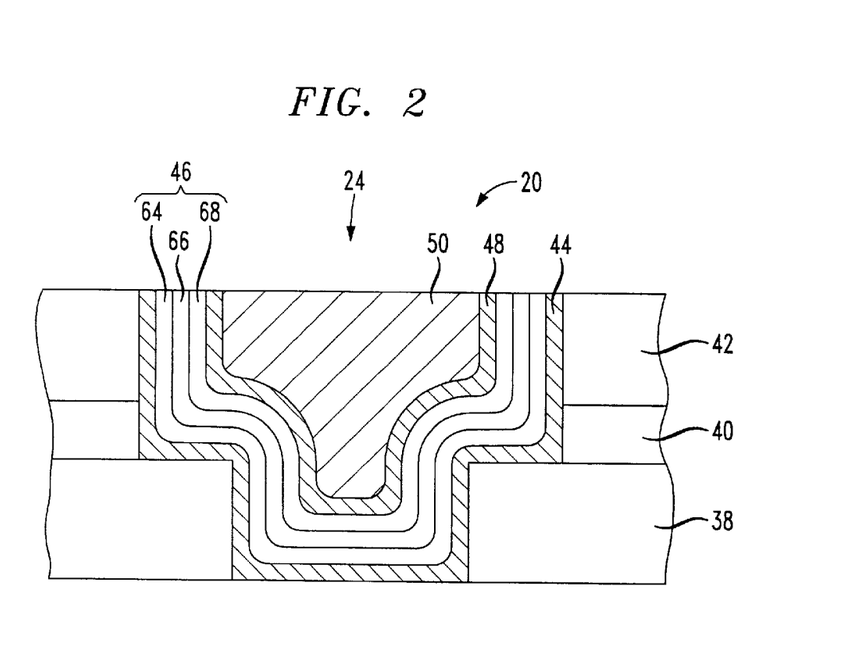
FIG. 2 is a cross-sectional view of a capacitor having metal electrodes and a composite dielectric in accordance with another embodiment of the present invention.

Referring to FIG. 2, a detailed embodiment of the capacitor 24 includes a high-k composite dielectric stack 46 made up of first, second and third metal oxide layers 64, 66 and 68. The first and third metal oxide layers 64 and 68 include a metal oxide with a relatively high dielectric constant such as $TiO_2$, $ZrO_2$ and $RuO_2$. The second metal oxide layer 66 can be formed of $Ta_2O_5$.

The capacitor 24 includes a metal electrodes 44 and 48 which may include a metal nitride, such as TiN, of which the titanium is capable of breaking down or reducing the metal oxide of the second metal oxide layer 66, into, for example, elemental tantalum. However, the high-k first and third metal oxide layers 64 and 68 substantially block the breakdown or reduction of the metal oxide of the second metal oxide layer 66 by the metal of the electrodes 44 and 48. Thus, the capacitor 24 having metal electrodes 44 and 48, includes a capacitor dielectric 46 that is a high-k, high quality and low leakage dielectric, and which prevents the reduction of the dielectric 46 by the metal of the electrodes 44 and 48.

Referring now to FIGS. 3–8, a dual damascene process for making the integrated circuit device 20 including a capacitor 24 formed on a semiconductor substrate 30 in accordance with the present invention, will now be described. As shown in FIG. 2, a semiconductor substrate 30 is provided, and a first dielectric layer 32 is formed adjacent the semiconductor substrate by conventional techniques. As mentioned above, the semiconductor substrate 30 is preferably silicon.

Figure 3:
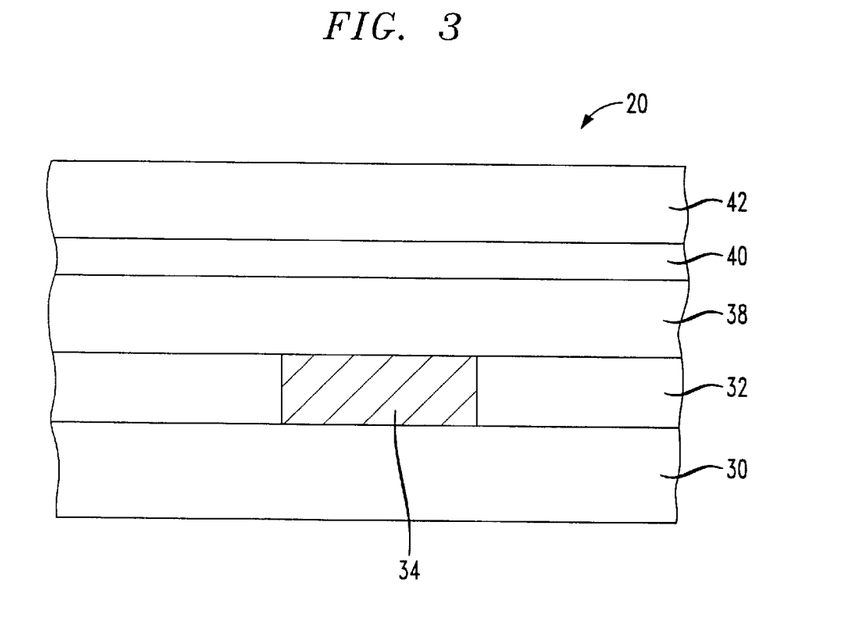
FIGS. 3–8 are cross-sectional views of an integrated circuit device to illustrate a dual damascene process for forming a capacitor in accordance with the present invention.

A plurality of devices, such as transistors (not shown), are formed in the substrate 30 using well known techniques. The semiconductor substrate 30 and other associated layers form a semiconductor wafer as known to those skilled in the art. The first dielectric layer 32 can be formed of silicon dioxide as well as other known dielectrics. Of course the first dielectric layer 32 may be deposited or grown. Further, the first dielectric layer 32 includes an interconnect 34. The interconnect 34 is formed by depositing a conductive metal, e.g. aluminum and/or copper, in a trench which has been etched in the first dielectric layer 32. The first dielectric layer 32 and the interconnect 34 illustrate an example of an underlying level of the integrated circuit device.

A second dielectric layer 38 is formed adjacent the first dielectric layer 32 and the interconnect 34. An etch stop layer 40 is formed over the second oxide layer 38 as illustrated. Next, a third dielectric layer 42 is formed adjacent the etch stop layer 40. Again, the second and third dielectric layers 38 and 42 are formed from any suitable dielectric having a desired dielectric constant, and are deposited or grown as would readily be appreciated by the skilled artisan. The etch stop layer 40 is typically formed from silicon nitride and deposited by conventional techniques. This non-conductive silicon nitride etch stop layer 40 is typically deposited on the associated dielectric layer, e.g. the second dielectric layer 38, using CVD at temperatures between about 600° C. and 900° C.

Figure 4:
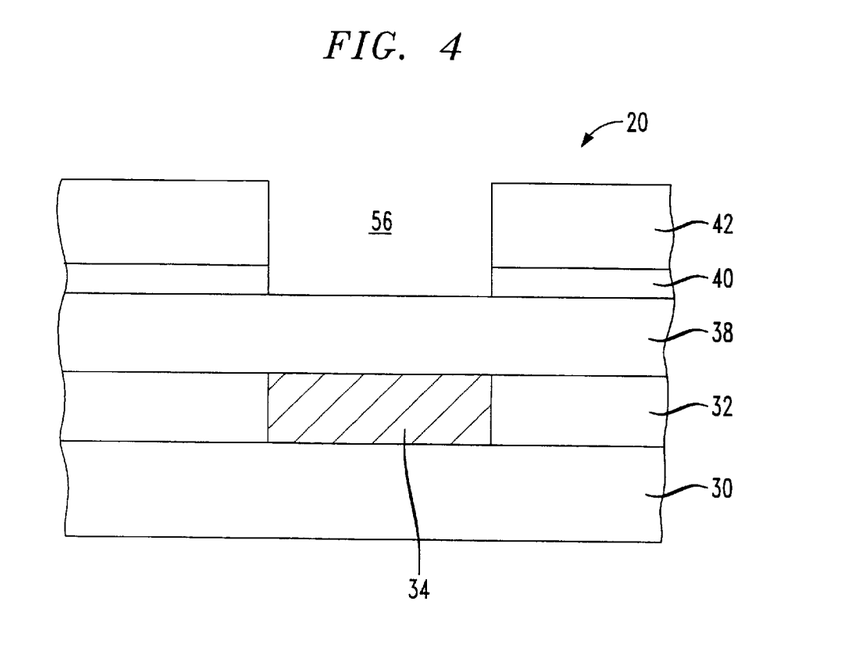

As shown in FIG. 4, a first opening 56 is selectively formed through the third dielectric layer 42 and also through the etch stop layer 40. Although the present description proceeds with the etching of the third dielectric layer 42 followed by the etching of the etch stop layer 40, other etching steps for etching the third dielectric layer and the etch stop layer can be used as would readily be appreciated by those skilled in the art. Furthermore, the skilled artisan would recognize that other dual damascene processes which may or may not include the use of an etch stop layer are known. The opening 56 will later be used to form a capacitor as will be explained below.

Figure 5:
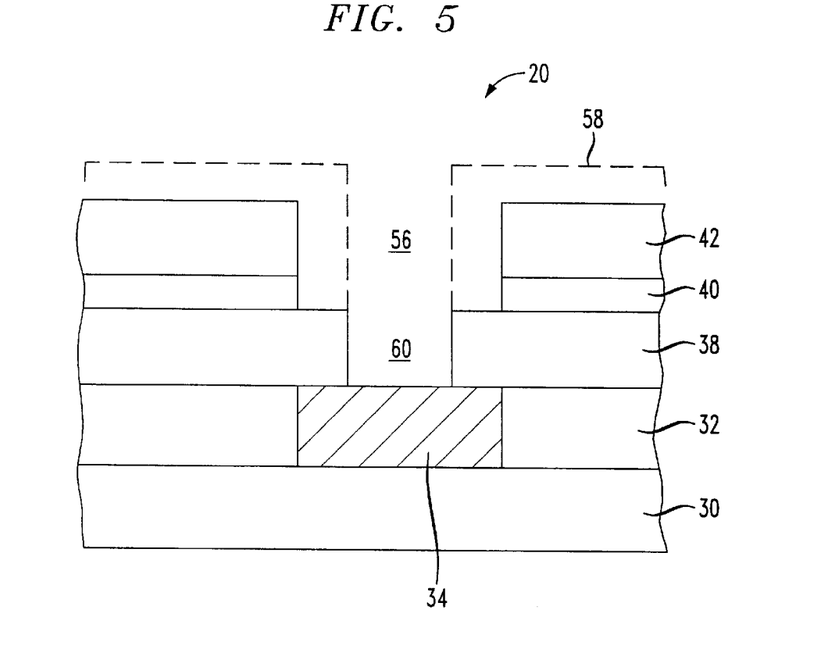

As is known in the damascene process as shown in FIG. 5, at least a second opening 60 is etched in the second dielectric layer 38 within the bounds defined by the first opening 56. A photo resist shown by the dashed lines at 58 is applied to form the second opening 60. The photo resist is then removed by techniques known to those skilled in the art. As illustrated, the opening 60 appears as an opening for forming a via between different layers, as is well known to those skilled in the art. However, although the opening 60 has been illustrated, as an example, as having a more narrow width than the opening 56, this opening 60 may also be formed with substantially the same width as opening 56.

Figure 6:
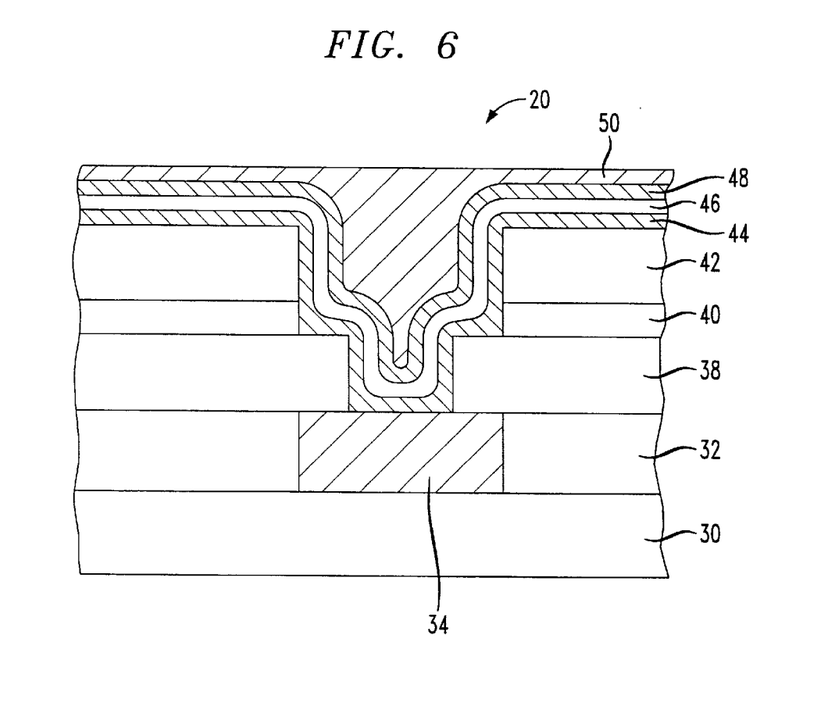

Referring to FIG. 6, a barrier metal such as tantalum nitride, titanium nitride or tungsten nitride, for example, is then deposited to form the lower electrode 44. Next, the capacitor dielectric 46 is formed by deposition or epitaxial growth. The capacitor dielectric 46 is formed of a suitable dielectric material, e.g. silicon oxide, silicon nitride, tantalum oxide, or a composite dielectric having a desired dielectric constant. Preferably, the capacitor dielectric 46 has a dielectric constant greater than about 25 to achieve the desired capacitor characteristics. Then, a barrier metal layer 48 such as tantalum nitride, titanium nitride or tungsten nitride, for example, is then deposited to form part of the upper electrode 48/50. As illustrated, the materials forming the lower electrode 44, the barrier metal layer 48 and the dielectric 46, have been blanket deposited over the upper surface of the integrated circuit device 20.

Referring to FIG. 6, a conductive metal layer 50, e.g. aluminum and/or copper, is deposited to form part of the upper electrode 48/50, such that the conductive metal layer 50 is deposited within a remaining portion of the opening 56. The conductive metal layer 50 may be blanket deposited over the entire upper surface of the integrated circuit device 20. The conductive metal layer 50 can be deposited by electrodeposition, electroplating or chemical vapor deposition techniques well known to those skilled in the art. Of course if copper is used as the conductive metal layer 50, a copper seed layer (not shown) may be initially formed on the metal layer 48.

Figure 7:
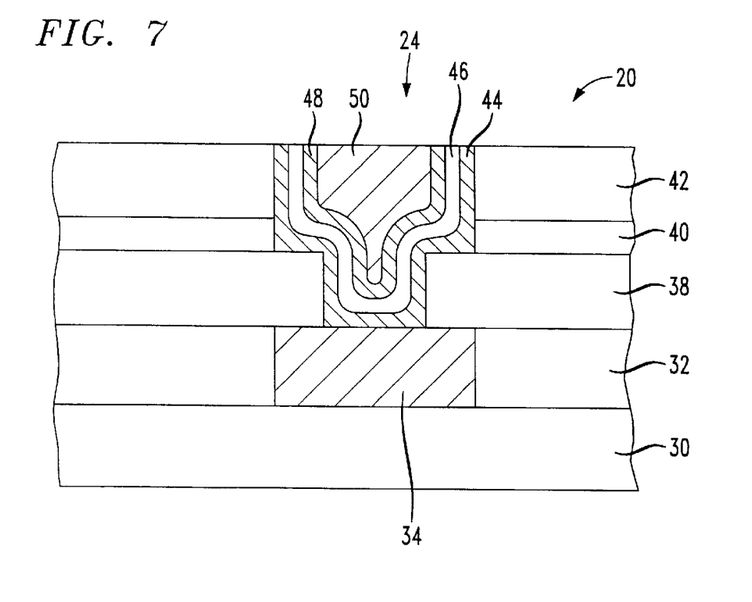

An upper surface of the integrated circuit device is them planarized using CMP, for example, as shown in FIG. 7. To prevent shorting of the two electrodes 44, 48/50 at the edges of the capacitor 24, a selective etch can be performed that will etch the material of the lower electrode 44 and the barrier metal layer 48 at their respective edges without etching the capacitor dielectric 46 or the conductive metal layer 50. Thus, there may be a slight recess (not shown) at the edges of the lower electrode 44 and the barrier metal layer 48 to prevent shorting of the electrodes 44, 48/50.

Figure 8:
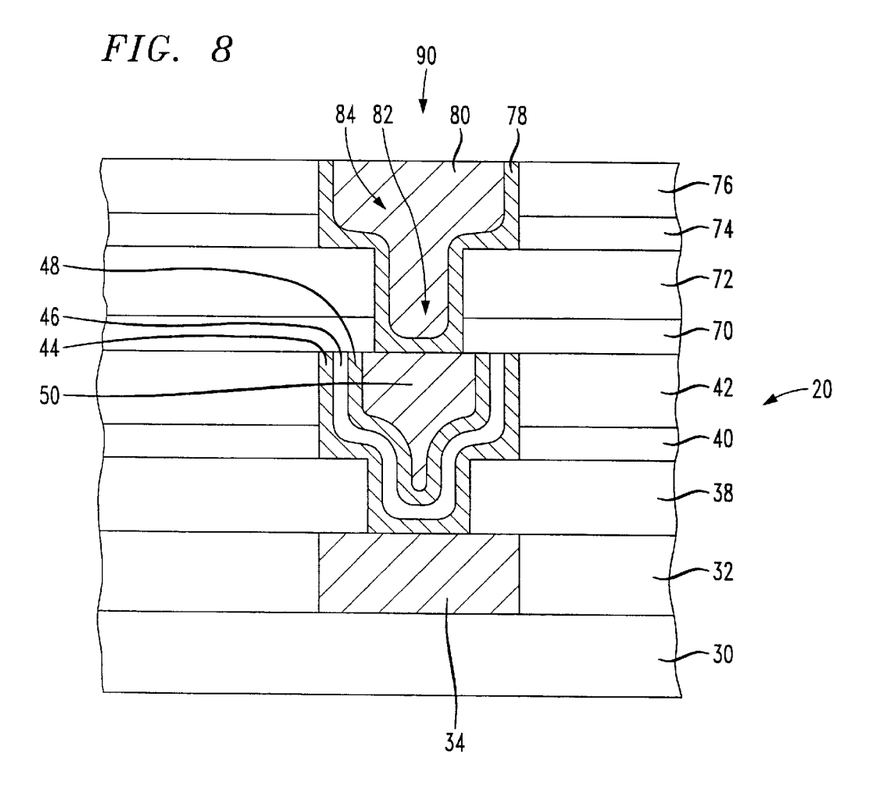

Referring to FIG. 8, the formation of a contact 90 for the upper electrode 48/50 is now described. A typical dual damascene metallization process is followed with the formation of a second etch stop layer 70, a fourth dielectric layer 72, a third etch stop layer 74 and a fifth dielectric layer 76. The second etch stop layer 70, similar to etch stop layer 40 is formed over the capacitor 24 to protect the exposed edges thereof. The second and third etch stop layers 70 and 74 are deposited by conventional techniques and are typically formed from silicon nitride but may also be a different material than etch stop layer 40. The fourth and fifth dielectric layers 72 and 76 are formed from any suitable dielectric having a desired dielectric constant, and are deposited or grown as would readily be appreciated by the skilled artisan. Openings 82 and 84 are selectively formed in layers 70–76. The opening 82 is formed with a smaller width than the width of the conductive metal layer 50. A barrier metal layer 78 and a second conductive metal layer 80 are deposited to form the contact 90 for the upper electrode 48/50

Thus the capacitor 24 has a substantially planar upper surface substantially flush with adjacent upper surface portions of the third dielectric layer 42. Also, edges of the lower metal 44 electrode and the capacitor dielectric 46 terminate at the upper surface of the capacitor. A dual damascene process has been described for making the integrated circuit device 20 of the present invention with a high-density capacitor 24 having metal electrodes 44, 48/50 and which is compatible and integrated with other dual damascene structures. The process of the present invention does not require etching metal layers or CMP of oxides to form a capacitor having metal electrodes. Furthermore, the formation of the contacts, e.g. 34 and 90, for the capacitor electrodes 44 and 48/50 is also compatible with the dual damascene process.

Figure 9:
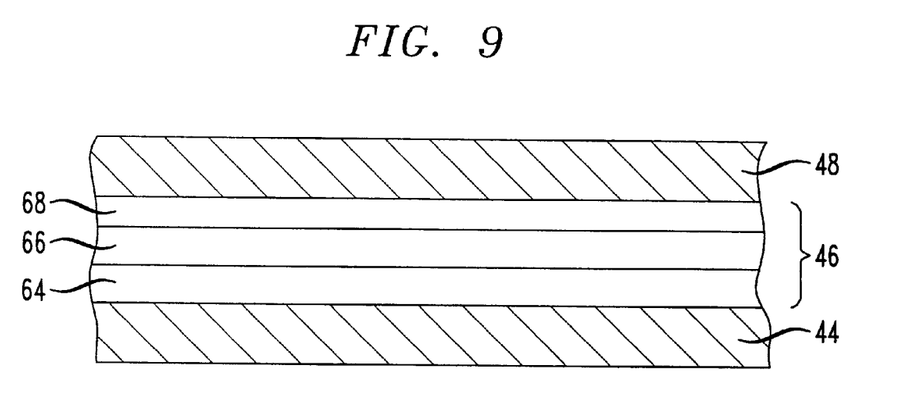
FIG. 9 is a cross-sectional view to illustrate the process of making the capacitor of the embodiment of FIG. 2.

Additionally, referring to FIG. 9, the process steps to form the capacitor dielectric 46 as a composite dielectric, are now described. A first metal oxide layer 64 is deposited and includes a metal oxide with a relatively high dielectric constant such as $TiO_2$, $ZrO_2$ and $RuO_2$. Such a metal oxide is preferably $TiO_2$. Next, a second metal oxide layer 66, such as $Ta_2O_5$, is deposited using chemical vapor deposition techniques, for example. This is followed by the deposition of a third metal oxide layer 68 as illustrated in FIG. 8. As also discussed above, this third metal oxide layer 68 includes a metal oxide with a relatively high dielectric constant such as $TiO_2$, $ZrO_2$ and $RuO_2$. Again, such a metal oxide is preferably $TiO_2$.

The first, second and third metal oxide layers 64, 66 and 68 make up the high-k composite dielectric layer 46. Furthermore, it is the high-k first and third metal oxide layers 64 and 68 which will substantially block the reduction of the metal oxide of the second metal oxide layer 66 by the metal of the previously and subsequently deposited metal electrodes 44 and 48, shown in FIG. 8.

The thicknesses of the various layers may vary as would be appreciated by those skilled in the art. For example, the first dielectric layer 32 can be deposited over the substrate by chemical vapor deposition (CVD) from a TEOS source gas and could have a thickness of about 400 to 600 nanometers or greater. The second and third dielectric layers 38 and 42 can also be formed in a similar thickness range. The appropriate silicon nitride etch stop layer 40 can have a thickness between about 20 to 150 nm, for example. Naturally, this is only a range of thickness, which can vary depending on the thickness desired and the end use of the semiconductor devices.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An integrated circuit device comprising:
   a semiconductor substrate;
   a dielectric layer, adjacent the semiconductor substrate, and having an opening therein, the dielectric layer comprising a lower dielectric layer portion adjacent the semicondutor substrate, an etch stop layer on the lower dielectric layer portion, and an upper dielectric layer portion on the etch stop layer, the opening having an upper portion in the upper dielectric layer portion and the etch stop layer, and a lower portion in the lower dielectric layer portion; and
   a capacitor comprising in stacked relation a lower electrode lining the opening, a capacitor dielectric layer adjacent the lower electrode, and an upper electrode adjacent the capacitor dielectric layer, the capacitor having a substantially planar upper surface substantially flush with adjacent upper surface portions of the dielectric layer.

2. An integrated circuit device according to claim 1 wherein edges of the lower electrode and the capacitor dielectric layer terminate at the upper surface of the capacitor.

3. An integrated circuit device according to claim 1, wherein the opening has a substantially uniform width between sidewalls of the opening from a top of the opening to a bottom of the opening.

4. An integrated circuit device according to claim 1, wherein the upper portion has a greater width than the lower portion.

5. An integrated circuit device according to claim 1, wherein the upper metal electrode comprises a barrier metal layer adjacent the capacitor dielectric layer and a copper layer adjacent the barrier metal layer.

6. An integrated circuit device according to claim 5 wherein the barrier metal layer comprises tantalum nitride.

7. An integrated circuit device according to claim 1, wherein each of the upper and lower metal electrodes comprises tantalum nitride.

8. An integrated circuit device according to claim 1, wherein the capacitor dielectric layer has a dielectric constant greater than about 25.

9. An integrated circuit device according to claim 1, wherein the capacitor dielectric comprises a first metal oxide layer, a tantalum oxide layer on the first metal oxide layer, and a second metal oxide layer on the tantalum oxide layer opposite the first metal oxide layer; and wherein each of the upper and lower metal electrodes comprises a metal nitride.

10. An integrated circuit device according to claim 9 wherein each of the first and second metal oxide layers comprises titanium oxide.

11. An integrated circuit device according to claim 9 wherein each of the upper and lower metal electrode layers comprises titanium nitride.

12. An integrated circuit device comprising:
    a semiconductor substrate;
    a dielectric layer, adjacent the semiconductor substrate, and having an opening therein, the dielectric layer comprising a lower dielectric layer portion adjacent the semicondutor substrate, an etch stop layer on the lower dielectric layer portion, and an upper dielectric layer portion on the etch stop layer, the opening having an upper portion in the upper dielectric layer portion and the etch stop layer, and a lower portion in the lower dielectric layer portion; and
    a capacitor comprising in stacked relation a lower electrode lining the opening, a capacitor dielectric layer adjacent the lower electrode, and an upper electrode adjacent the capacitor dielectric layer;

the capacitor dielectric comprising in stacked relation a first metal oxide layer, a tantalum oxide layer, and a second metal oxide layer;

the upper and lower metal electrodes comprising a metal nitride; and the capacitor having a substantially planar upper surface substantially flush with adjacent upper surface portions of the dielectric layer.

13. An integrated circuit device according to claim 12 a wherein edges of the lower electrode and the capacitor dielectric layer terminate at the upper surface of the capacitor.

14. An integrated circuit device according to claim 12, wherein the opening has a substantially uniform width between sidewalls of the opening from a top of the opening to a bottom of the opening.

15. An integrated circuit device according to claim 12, wherein the upper portion has a greater width than the lower portion.

16. An integrated circuit device according to claim 12, wherein the upper metal electrode comprises a barrier metal layer adjacent the capacitor dielectric layer and a copper layer adjacent the barrier metal layer.

17. An integrated circuit device according to claim 16, wherein the barrier metal layer comprises tantalum nitride.

18. An integrated circuit device according to claim 12, wherein each of the upper and lower metal electrodes comprises tantalum nitride.

19. An integrated circuit device according to claim 12 wherein the capacitor dielectric layer has a dielectric constant greater than about 25.

20. An integrated circuit device according to claim 12 wherein each of the first and second metal oxide layers comprises titanium oxide.

21. An integrated circuit device according to claim 20 wherein each of the upper and lower metal electrode layers comprises titanium nitride.

* * * * *